(12) United States Patent
Padure et al.

(10) Patent No.: US 7,868,693 B2
(45) Date of Patent: *Jan. 11, 2011

(54) CLASS-D AMPLIFIER

(75) Inventors: Marius Padure, Bucharest (RO); Laszlo Lipcsei, Campbell, CA (US); Serban Mihai Popescu, San Carlos, CA (US)

(73) Assignee: 02Micro International Limited, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 12/398,640

(22) Filed: Mar. 5, 2009

(65) Prior Publication Data

US 2010/0052783 A1    Mar. 4, 2010

Related U.S. Application Data

(63) Continuation of application No. 12/009,293, filed on Jan. 17, 2008, now Pat. No. 7,501,886, which is a continuation-in-part of application No. 11/643,196, filed on Dec. 20, 2006, now Pat. No. 7,471,144.

(60) Provisional application No. 60/785,105, filed on Mar. 22, 2006.

(51) Int. Cl.
   *H03F 3/38* (2006.01)
(52) U.S. Cl. ........................... 330/10; 330/207 A
(58) Field of Classification Search ............ 330/9, 330/10, 251, 207 A
   See application file for complete search history.

(56) References Cited

U.S. PATENT DOCUMENTS

| | | | |
|---|---|---|---|
| 5,805,020 A | 9/1998 | Danz et al. | |
| 6,614,297 B2 * | 9/2003 | Score et al. | 330/10 |
| 6,707,337 B2 * | 3/2004 | Noro | 330/10 |
| 7,221,216 B2 | 5/2007 | Nguyen | |
| 7,427,893 B2 | 9/2008 | Liu et al. | |
| 7,501,886 B2 * | 3/2009 | Padure et al. | 330/10 |
| 2003/0030486 A1 | 2/2003 | Noro et al. | |
| 2006/0006933 A1 | 1/2006 | Nguyen | |

FOREIGN PATENT DOCUMENTS

EP    1587212    10/2005

* cited by examiner

*Primary Examiner*—Robert Pascal
*Assistant Examiner*—Khiem D Nguyen

(57) ABSTRACT

An amplifier that receives an input signal and outputs an amplified output signal includes an integration stage, a comparison stage, and a full bridge circuit. The integration stage is be used for receiving a constant common mode voltage, for receiving a first signal representing the input signal of the amplifier, and for generating a ramp signal. The comparison stage coupled to the integration stage is used for generating a pulse width modulation signal according to the ramp signal and according to a hysteretic signal. The full bridge circuit coupled to the comparison stage is used for receiving a power supply and the pulse width modulation signal, and for generating the output of the amplifier.

27 Claims, 8 Drawing Sheets

CLASS-D AMPLIFIER

RELATED UNITED STATES PATENT APPLICATIONS

This application is a Continuation Application of the co-pending, commonly-owned U.S. Patent Application with Ser. No. 12/009,293, filed on Jan. 17, 2008, by Marius Padure, et al., and entitled "Low Distortion Class-D Amplifier", which itself is a Continuation-in-part of the U.S. Patent Application with Ser. No. 11/643,196, filed on Dec. 20, 2006, now U.S. Pat. No. 7,471,144, which itself claims priority to U.S. Provisional Application No. 60/785,105, filed on Mar. 22, 2006, which is hereby incorporated by reference in its entirety.

TECHNICAL FIELD

This invention relates to an amplifier, and more particularly to a class-D amplifier.

BACKGROUND ART

One advantage of a class-D amplifier over a linear amplifier (e.g., a class-AB amplifier) is a relatively high efficiency of the class-D amplifier. Because the output pulses of the class-D amplifier can have a fixed amplitude, the switching elements are switched either on or off, rather than being operated in a linear mode. One exemplary application for a class-D amplifier is a driver for a loudspeaker.

However, some class-D amplifiers that employ standard implementations may have propagation delays and may have low power supply rejection ratios.

SUMMARY

In one embodiment, an amplifier that receives an input signal and outputs an amplified output signal includes an integration stage, a comparison stage, and a full bridge circuit. In one embodiment, the integration stage is used for receiving a constant common mode voltage, for receiving a first signal representing the input signal of the amplifier, and for generating a ramp signal. The comparison stage coupled to the integration stage is used for generating a pulse width modulation signal according to the ramp signal and according to a hysteretic signal. The full bridge circuit coupled to the comparison stage is used for receiving a power supply and the pulse width modulation signal, and for generating the output of the amplifier.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
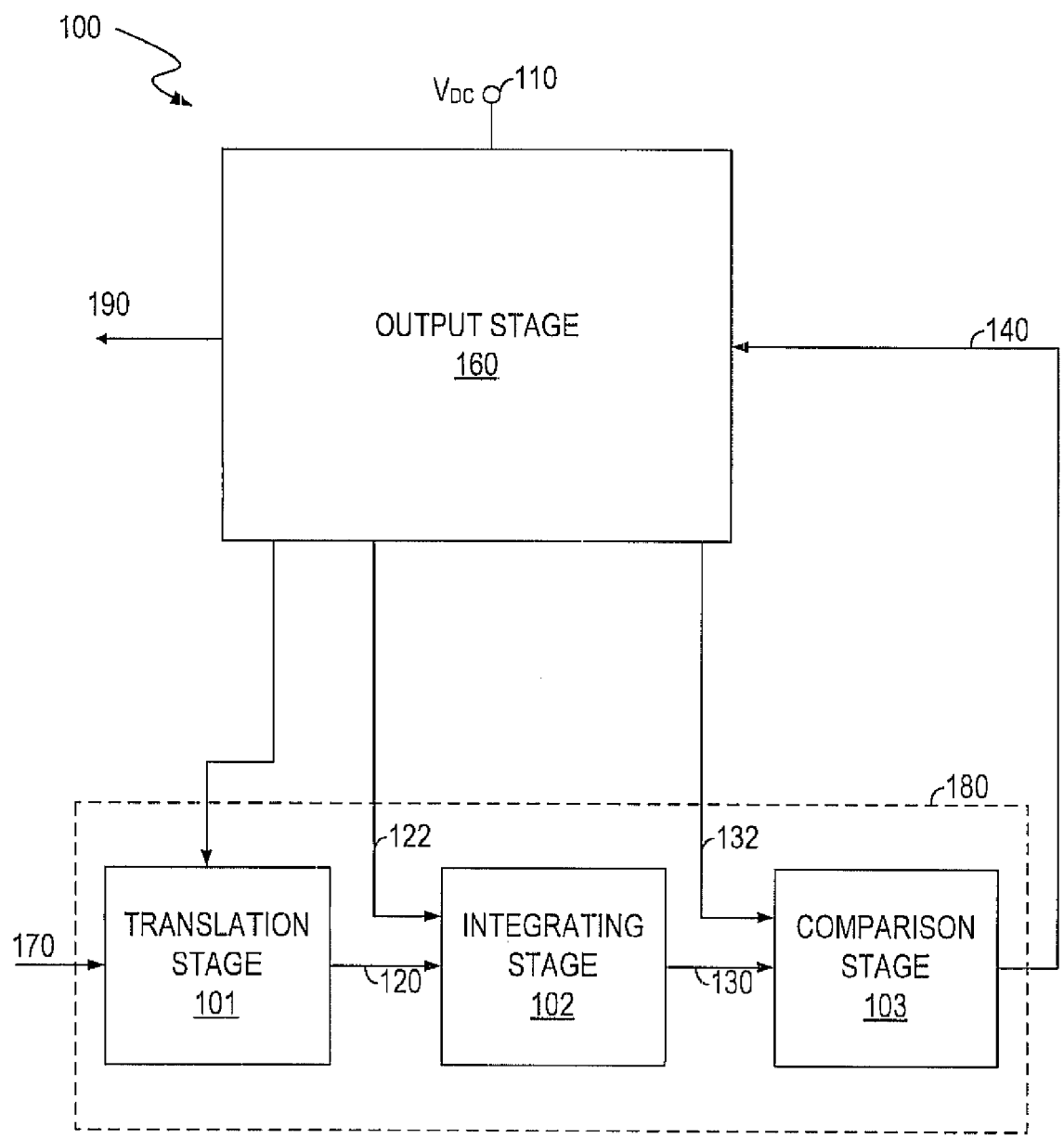
FIG. 1 shows a block diagram of an amplifier, in accordance with one embodiment of the present invention.

FIG. 1 shows a block diagram of a class-D amplifier 100, in accordance with one embodiment of the present invention. The class-D amplifier 100 has a relatively high power supply rejection ratio. As shown in FIG. 1, the class-D amplifier 100 includes a power supply terminal 110 for receiving a power supply $V_{DC}$, an amplification stage 180, and an output stage 160, in one embodiment.

The amplification stage 180 can receive an input signal 170 and generate a ramp signal 130. The amplification stage 180 can generate a pulse width modulation signal 140 according to the ramp signal 130 and a hysteretic signal 132 to drive the output stage 160. The ramp signal 130 and the hysteretic signal 132 are positioned at a voltage level that is half of the voltage level of the power supply $V_{DC}$ and that varies proportionally with the power supply $V_{DC}$, in one embodiment. For example, the ramp signal 130 and the hysteretic signal 132 are centered at the voltage level that is half of the voltage level of the power supply $V_{DC}$, in one embodiment.

The output stage 160 coupled to the power supply terminal 110 can receive the pulse width modulation signal 140 from the amplification stage 180 and can generate an amplified output signal 190. In one embodiment, the output stage 160 can be a full bridge circuit.

As shown in FIG. 1, the amplification stage 180 includes a first circuit shown as the translation stage 101 coupled to the full bridge circuit 160 for receiving the input signal 170 and for producing a translated signal 120 that is positioned at a voltage level that is half of the voltage level of the power supply $V_{DC}$. More specifically, when the input voltage $V_{170}$ is equal to zero, a voltage level of the translated signal 120 can be equal to half of the voltage level of the power supply $V_{DC}$.

The amplification stage 180 further includes a second circuit shown as the integration stage (e.g., an integrator) 102 that can receive the translated signal 120 from the translation stage 101 and an integrating signal 122 from the full bridge circuit 160, and can generate the ramp signal 130 therefrom. Advantageously, an oscillator and a ramp generator can be omitted, in one embodiment.

A comparison stage 103 can receive the ramp signal 130 and the hysteretic signal 132, and can generate the pulse width modulation signal 140 to drive the full bridge circuit 160. In one embodiment, the ramp signal 130 is within a hysteretic window of the hysteretic signal 132.

To summarize, in one embodiment, the amplifier 100 in FIG. 1 includes a power supply terminal 110 for receiving power, a full bridge circuit 160 coupled to the power supply terminal 110 for providing an amplified output 190, a translation stage 101 coupled to the full bridge circuit 160 for receiving an input signal 170 and producing a translated signal 120, an integration stage 102 that can receive the translated signal 120 from the translation stage 101 and an integrating signal 122 from the full bridge circuit 160, and generate a ramp signal 130 therefrom, and a comparison stage 103 that can receive the ramp signal 130 from the integration stage 102 and a hysteretic signal 132 from the full bridge circuit 160, and generate a pulse width modulation signal 140 to drive the full bridge circuit 160.

In one embodiment, the ramp signal 130 and the hysteretic signal 132 are positioned at a voltage level that is half of the voltage level of the power supply $V_{DC}$ and that varies proportionally with the power supply $V_{DC}$. For example, the hysteretic signal 132 can have a maximum and a minimum value, and the range between the maximum and the minimum values of the hysteretic signal 132 is centered at half of the voltage level of the power supply $V_{DC}$. Similarly, the ramp signal 130 can have a maximum and a minimum value, and the range between the maximum and the minimum values of the ramp signal 130 is centered at half of the voltage level of the power supply $V_{DC}$.

Figure 2:
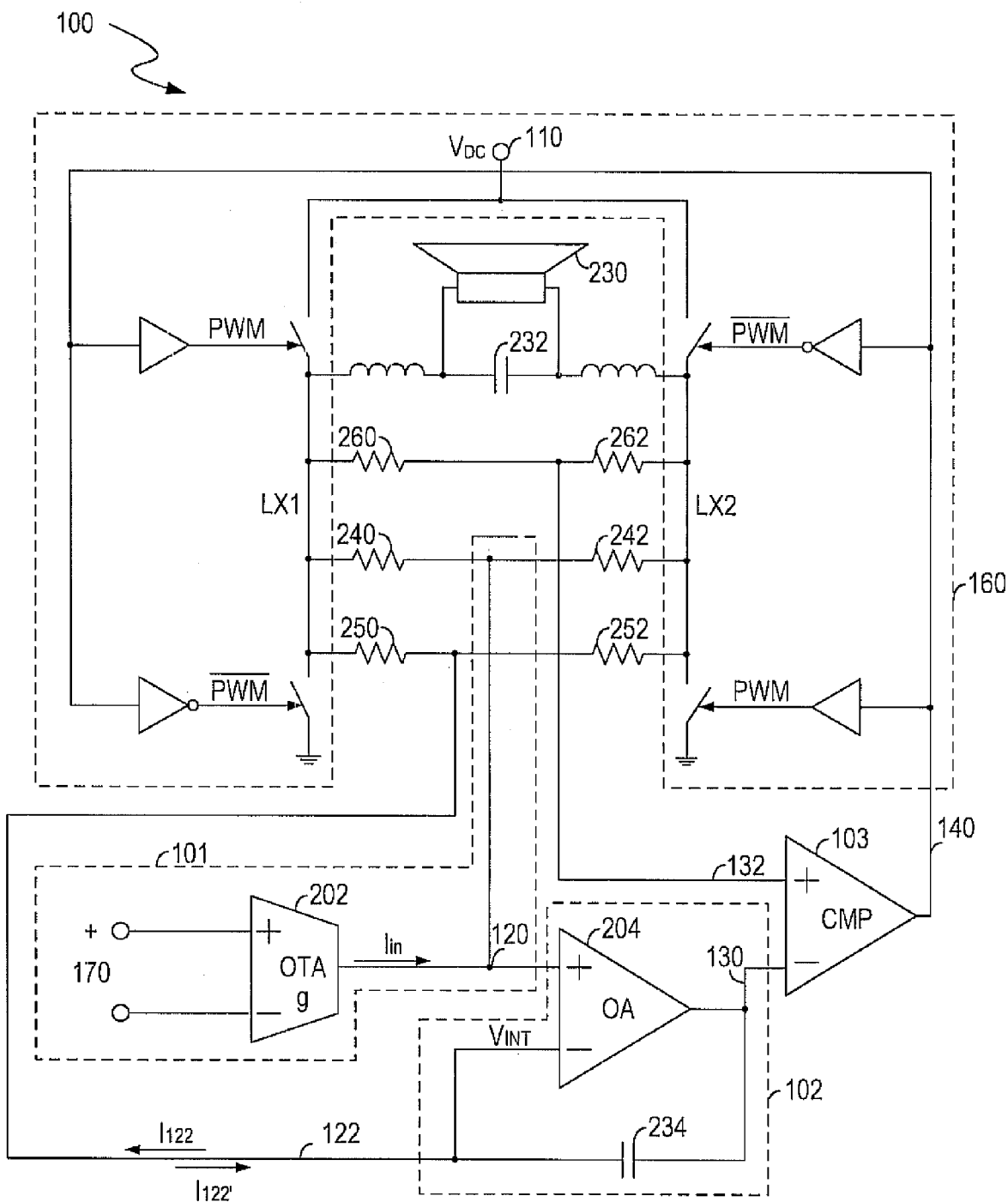
FIG. 2 shows a detailed circuit diagram of the amplifier in FIG. 1 coupled to a loud speaker, in accordance with one embodiment of the present invention.

FIG. 2 shows a detailed circuit diagram of the amplifier 100 in FIG. 1 coupled to a loud speaker 230, in accordance with one embodiment of the present invention. Elements labeled the same as in FIG. 1 have similar functions and will not be repetitively described herein for purposes of brevity and clarity.

The amplifier 100 in FIG. 2 further includes a first resistor divider, shown as resistor 260 and resistor 262, coupled between the first switching node LX1 and the second switching node LX2 of the full bridge circuit 160 for providing the hysteretic signal 132 to the comparison stage 103.

The first resistor divider includes a first resistor 260 and a second resistor 262. In one embodiment, the first resistor 260 includes a first resistance $R_1$ less a second resistance $\Delta R_1$. In one embodiment, the second resistor 262 includes the first resistance $R_1$ added to the second resistance $\Delta R_1$. Therefore, $R_{260}=R_1-\Delta R_1$ and $R_{262}=R_1+\Delta R_1$.

The amplifier 100 further includes a second resistor divider, shown as resistor 250 and resistor 252, coupled between the first switching node LX1 and the second switching node LX2 of the full bridge circuit 160 for providing the integrating signal 122 to the integration stage 102.

The second resistor divider includes a first resistor 250 and a second resistor 252. In one embodiment, the first resistor 250 includes a first resistance $R_2$ added to a second resistance $\Delta R_2$. In one embodiment, the second resistor 252 includes the first resistance $R_2$ less the second resistance $\Delta R_2$. Therefore, $R_{250}=R_2+\Delta R_2$ and $R_{252}=R_2-\Delta R_2$.

In one embodiment, the translation stage 101 includes an operational transconductance amplifier 202 which is coupled to the integration stage 102 for converting the input signal 170 to an input current $I_{in}$. The amplifier 100 further includes a resistor divider, shown as resistor 240 and resistor 242, coupled between LX1 and LX2 for receiving the input current $I_{in}$ and producing a translated signal 120. The translated signal 120 can be equal to half of the voltage level of the power supply $V_{DC}$ when a voltage $V_{170}$ of the input signal 170 is equal to zero, in one embodiment. The resistor 240 and the resistor 242 have the same resistance R, in one embodiment.

The integration stage 102 includes an operational amplifier 204 and a capacitor 234. The integration stage 102 can receive the translated signal 120 and the integrating signal 122, and generate a ramp signal 130 to the comparison stage 103, in one embodiment.

The comparison stage shown as the comparator 103 can compare the hysteretic signal 132 with the ramp signal 130, and generate a pulse width modulation signal 140 to drive the full bridge circuit 160, in one embodiment. The output capacitor 232 that is coupled between the first switching node LX1 and the second switching node LX2 can provide the amplified output signal to the speaker 230. As such, the speaker 230 can receive the amplified audio signal and generate audible sound therefrom.

In operation, the operational transconductance amplifier 202 can convert the input voltage $V_{170}$ to an input current $I_{in}$ and can use the resistor divider, shown as resistors 240 and 242, to create a translated signal 120. If a gain of the operational transconductance amplifier 202 is g, then the voltage of the translated signal 120 can be given by:

$$V_{120}=g*(R/2)*V_{170}+V_{DC}/2. \quad (1)$$

In one embodiment, the first switching node LX1 and the second switching node LX2 of the full bridge circuit 160 are out of phase. Therefore, an integrating current flowing through the capacitor 234 can have two different levels $I_{122}$ and $I_{122}'$ depending on the states of the switching nodes LX1 and LX2. In one embodiment, when the pulse width modulation signal 140 is high, the voltage at LX1 is $V_{DC}$ and the voltage at LX2 is zero. In contrast, when the pulse width modulation signal 140 is low, the voltage at LX1 is zero and the voltage at LX2 is $V_{DC}$.

In one embodiment, since a voltage $V_{int}$ at the inverting input (negative terminal) of the operational amplifier 204 is equal to the voltage $V_{120}$ at the non-inverting input (positive terminal) of the operational amplifier 204, the integrating current $I_{122}$ when the pulse width modulation signal 140 is high and the integrating current $I_{122}'$ when the pulse width modulation signal 140 is low can be respectively given by:

$$I_{122}=(V_{DC}-V_{120})/(R_2+\Delta R_2)-V_{120}/(R_2-\Delta R_2),\text{ when the pulse width modulation signal 140 is high;} \quad (2)$$

$$I_{122}'=(V_{DC}-V_{120})/(R_2-\Delta R_2)-V_{120}/(R_2+\Delta R_2),\text{ when the pulse width modulation signal 140 is low.} \quad (3)$$

Based on equation (1), equations (2) and (3) can be rewritten as:

$$I_{122}=(-V_{DC}*\Delta R_2-g*R*V_{170}*R_2)/(R_2^2-\Delta R_2^2)\text{ when the pulse width modulation signal 140 is high;} \quad (4)$$

$$I_{122}'=(V_{DC}*\Delta R_2-g*R*V_{170}*R_2)/(R_2^2-\Delta R_2^2)\text{ when the pulse width modulation signal 140 is low.} \quad (5)$$

In addition, according to the level of the pulse width modulation signal 140, the voltage $V_{132}$ of the hysteretic signal 132 can be given by:

$$V_{132}=V_{DC}*(R_1+\Delta R_1)/2R_1=V_{DC}/2+V_{DC}*\Delta R_1/2R_1,\text{ when the pulse width modulation signal 140 is high;} \quad (6)$$

$$V_{132}'=V_{DC}*(R_1-\Delta R_1)/2R_1=V_{DC}/2-V_{DC}*\Delta R_1/2R_1,\text{ when the pulse width modulation signal 140 is low.} \quad (7)$$

In one embodiment, an amplitude $A_{130}$ of the ramp signal 130 is equal to a voltage difference between $V_{132}$ and $V_{132}'$. Therefore, the amplitude $A_{130}$ can be given by:

$$A_{130}=V_{DC}*\Delta R_1/R_1. \quad (8)$$

As such, a parameter limit of the ramp signal 130 can be defined by the first resistance $R_1$ and the second resistance $\Delta R_1$ of the resistor divider, shown as resistors 260 and 262. In one embodiment, the aforementioned parameter limit of the ramp signal 130 includes the amplitude $A_{130}$ of the ramp signal 130.

Figure 3:
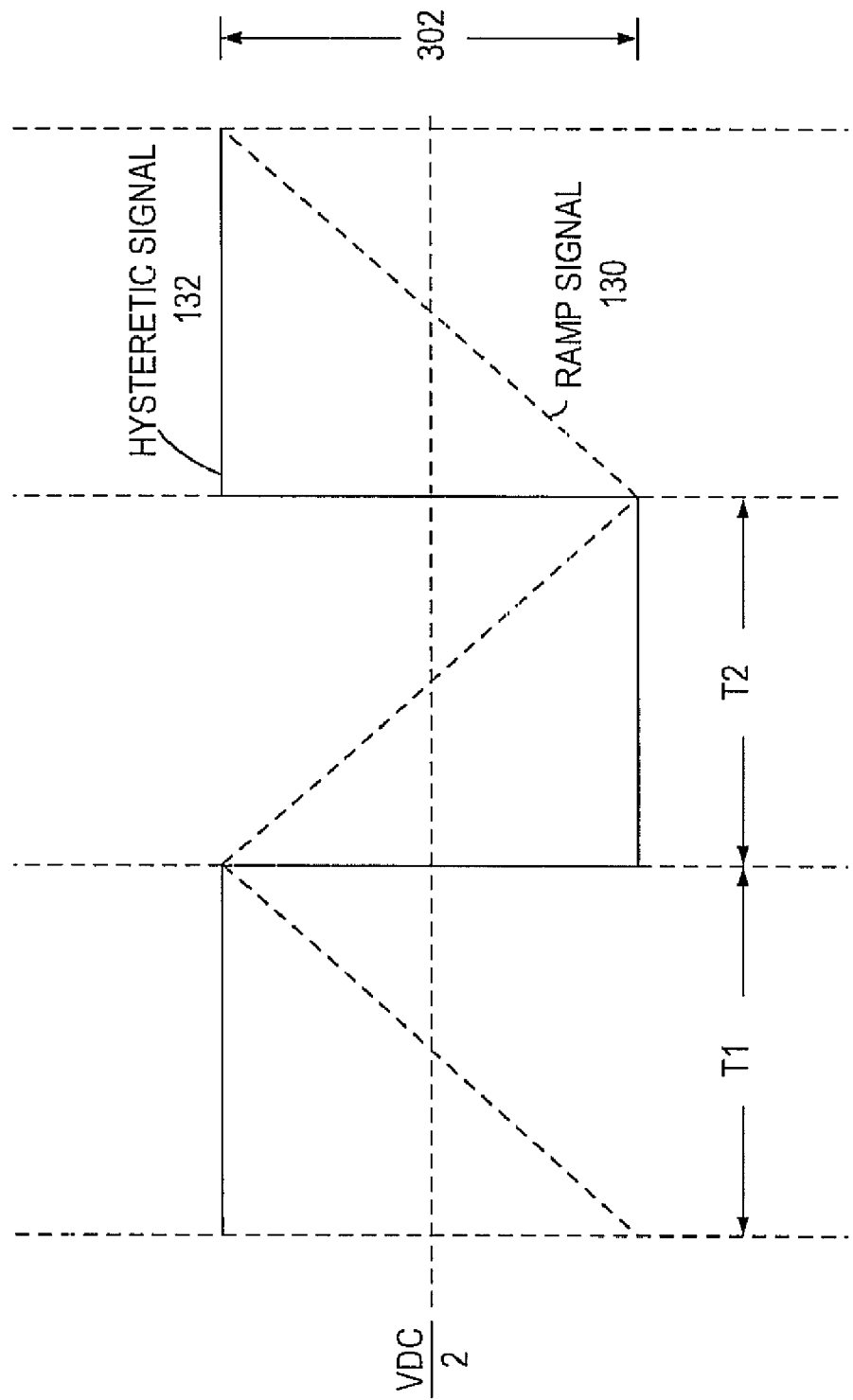
FIG. 3 shows the waveforms for the hysteretic signal and the ramp signal, in accordance with one embodiment of the present invention.

FIG. 3 shows exemplary waveforms for the hysteretic signal 132 and the ramp signal 130, in accordance with one embodiment of the present invention. In the example of FIG. 3, $T_1$ is the period when the pulse width modulation signal 140 is high, and $T_2$ is the period when the pulse width modulation signal 140 is low. FIG. 3 is described in combination with FIG. 2.

As shown in FIG. 3, the ramp signal 130 is within a hysteretic window 302 of the hysteretic signal 132. In the example of FIG. 3, during period $T_1$, the voltage level of the hysteretic signal 132 is above the $V_{DC}/2$ level according to equation (6). In addition, during period $T_2$, the voltage level of the hysteretic signal 132 is below the $V_{DC}/2$ level according to equation (7), in one embodiment. In one embodiment, when the hysteretic signal 132 is greater than the ramp signal 130, the pulse modulation signal 140 is high, such that the current $I_{122}$ can flow through the capacitor 234 and a voltage level of the ramp signal 130 can increase until the level of the ramp signal 130 reaches the level of the hysteretic signal 132 at a certain point. Then the comparator 103 can output a low level signal 140. As a result, the hysteretic signal 132 can drop below the $V_{DC}/2$ level, such that the current $I_{122}'$ can flow through the capacitor 234 and the ramp signal 130 can gradually decrease towards the hysteretic signal 132 as shown in period $T_2$. The comparator 103 continues to output a low voltage signal 140 until the level of the ramp signal 130 decreases to the level of the hysteretic signal 132.

Advantageously, the pulse width modulation signal 140 can be generated according to the ramp signal 130 and the hysteretic signal 132, and both hysteretic signal 132 and ramp signal 130 can be positioned at a voltage level that is half of the power supply voltage $V_{DC}$, in one embodiment. More specifically, the range between the maximum and the minimum values of the hysteretic signal 132 is centered at half of the voltage level of the power supply $V_{DC}$. Similarly, the range between the maximum and the minimum values of the ramp signal 130 is centered at the half of voltage level of the power supply $V_{DC}$.

Advantageously, in one embodiment, the hysteretic window 302 of the hysteretic signal 132 is defined by the states of the switching nodes LX1 and LX2 of the full bridge circuit 160, which can reduce/eliminate the errors associated with the propagation delays on the drivers and the power switches in the full bridge circuit 160 and can also reduce/eliminate the errors caused by the power switches un-matching.

In one embodiment, if the period $T_1$ is relatively short, the current $I_{122}$ during the period $T_1$ can regarded as a constant. Similarly, if the period $T_2$ is relatively short, the current $I_{122}'$ during the period $T_2$ can regarded as a constant. Therefore, the charge change $\Delta Q$ of the capacitor 234 in the integration stage 102 in FIG. 1 can be given by:

$$\Delta Q=C_{234}*A_{130}=-I_{122}*T_1=I_{222}'*T_2. \quad (9)$$

Therefore, when equations (3) and (4) are substituted into equation (9), the following equation can be obtained:

$$V_{DC}*(T_2-T_1)/(T_2+T_1)=g*R*R_2/\Delta R_2*V_{170}. \quad (10)$$

An equivalent theoretical voltage $V_{190}$ of the output signal 190 across the output capacitor 232 is equal to:

$$V_{190} = T_1/(T_1 + T_2) * V_{DC} - T_2/(T_1 + T_2) * V_{DC} \quad (11)$$
$$= (T_1 - T_2)/(T_1 + T_2) * V_{DC}.$$

Therefore, a gain A of the amplifier 100 can be given by:

$$A=V_{190}/V_{170}=-g*R*R_2/\Delta R_2. \quad (12)$$

Advantageously, the gain A of the amplifier 100 does not depend on the power supply $V_{DC}$, which can ensure relatively high power supply rejection ratio of the amplifier 100, in one embodiment.

According to equation (9), the switching frequency of the full bridge circuit 160 can be given by:

$$f_{sw}=1/(T_1+T_2)=1/((-C_{234}*A_{130}/I_{122})+(C_{234}*A_{130}/I_{122}')). \quad (13)$$

When equation (2) and (3) are substituted into equation (13), the switching frequency becomes:

$$f_{sw}=(V_{DC}^2*\Delta R_2^2*g^2*R^2*V_{170}*R_2^2)/(C_{234}*A_{130}*(R_2^2-\Delta R_2^2)*2*V_{DC}*\Delta R_2). \quad (14)$$

When equation (8) is substituted into equation (14), the switching frequency becomes:

$$f_{sw}=R_1*\Delta R_2/(2C_{234}*\Delta R_1*(R_2^2-\Delta R_2^2))-g^2*R^2*V_{170}^2*R_2^2*R_1/(2C_{234}*\Delta R_1*V_{DC}^2*\Delta R_2^2*(R_2^2-\Delta R_2^2)). \quad (15)$$

If assume that $K_1=R_1*\Delta R_2/(2C_{234}*\Delta R_1*(R_2^2-\Delta R_2^2))$ and $K_2=g^2*R^2*R_2^2*R_1/(2C_{234}*\Delta R_1*\Delta R_2^2*(R_2^2-\Delta R_2^2))$, then equation (15) becomes $$f_{sw}=K_1-K_2*(V_{170}/V_{DC})^2. \quad (16)$$

$K_1$ and $K_2$ are constant. Therefore, the switching frequency $f_{sw}$ relates to the input voltage $V_{170}$ and the supply voltage $V_{DC}$. As such, the switching frequency $f_{sw}$ of the full bridge circuit 160 remains constant when the input signal 170 is zero, in one embodiment.

Accordingly, the present invention provides a low distortion class-D amplifier with high power supply rejection ratio. The gain of the class-D amplifier does not depend on the power supply, in one embodiment. In addition, no oscillator and ramp generator is required, in one embodiment. Furthermore, the present disclosure also provides an audio system comprising a low distortion class-D amplifier for receiving an audio signal, and a speaker coupled to the low distortion class-D amplifier for converting the audio signal to audible/audio sound.

Figure 4:
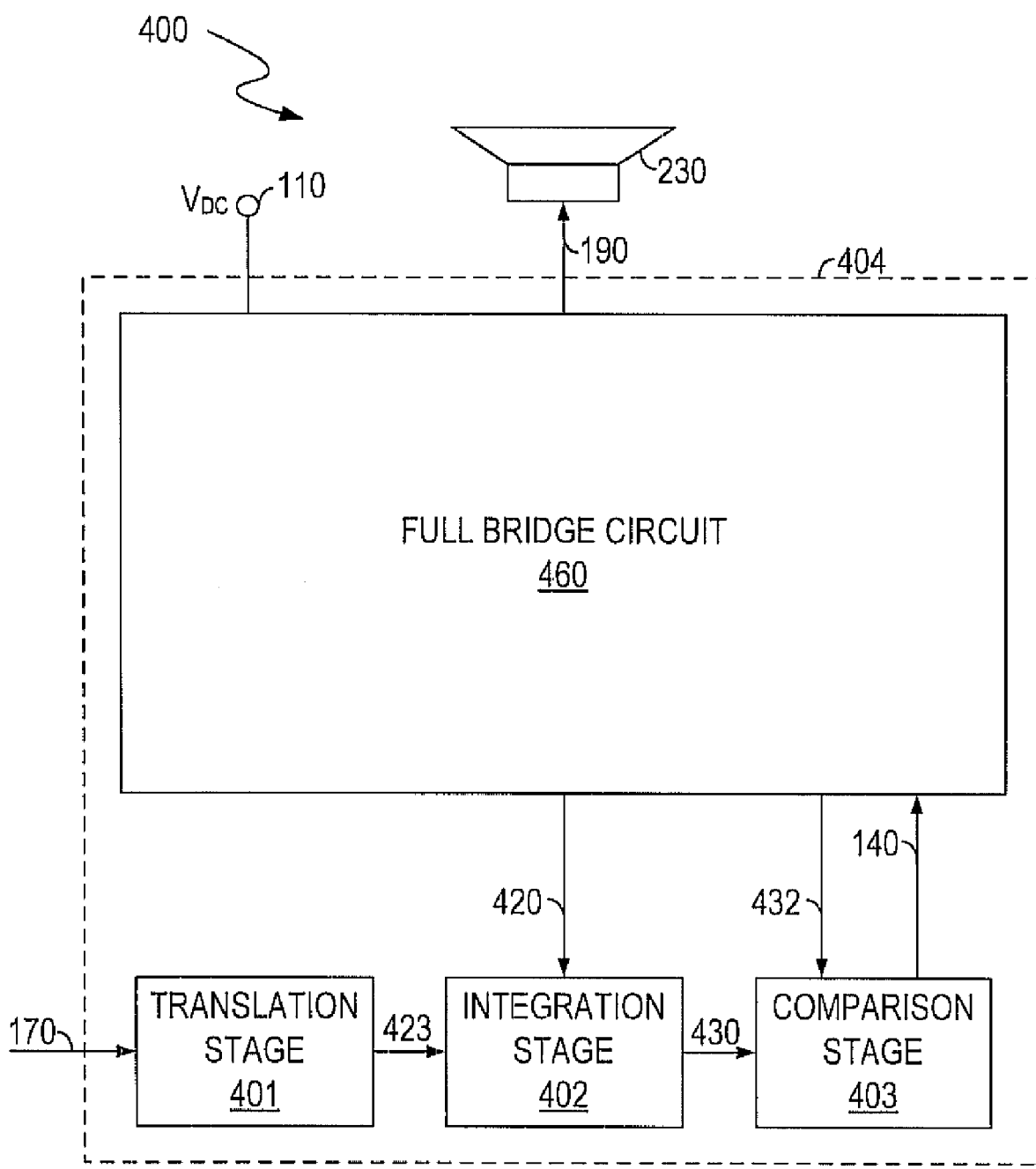
FIG. 4 shows a block diagram of an audio system, in accordance with one embodiment of the present invention.

FIG. 4 shows a block diagram of an audio system 400, in accordance with one embodiment of the present invention. Elements that are labeled similar as in FIG. 1 and FIG. 2 have similar functions and will not be repetitively described herein for purposes of brevity and clarity. As shown in FIG. 4, the audio system 400 includes an amplifier 404 coupled to a speaker 230. The amplifier 404 can be used for receiving an input signal 170 and for generating an output signal 190. The speaker 230 coupled to the amplifier 404 can be used for converting the output signal 190 to audible/audio sound.

More specifically, the amplifier 404 includes an integration stage 402 (e.g., an integrator) for receiving a constant common mode voltage $V_{CM}$, for receiving a first signal 423 representing the input signal 170 of the amplifier 404, and for generating a ramp signal 430. Additionally, the amplifier 404 includes a comparison stage 403 coupled to the integration stage 402 for generating a pulse width modulation signal 140 according to the ramp signal 430 and a hysteretic signal 432. The amplifier 404 further includes a full bridge circuit 460 (an output circuit) coupled to the comparison stage 403 for receiving a power supply $V_{DC}$ (at terminal 110) and the pulse width modulation signal 140, and for generating the output signal 190 of the amplifier 404.

In one embodiment, the amplifier 404 further includes a translation stage 401 coupled to the integration stage 402 for receiving the input signal 170, and for generating a signal 423 representing the input signal 170 to the integration stage 402. In one embodiment, the full bridge circuit 460 can be used for providing the hysteretic signal 432 to the comparison stage 403, and for providing a signal 420 to the integration stage 402.

Advantageously, by using the translation stage 401, the integration stage 402, the comparison stage 403 and the full bridge circuit 460, a gain of the amplifier 404 can remain constant even if the power supply $V_{DC}$ varies, in one embodiment. Furthermore, in one embodiment, a switching frequency of the full bridge circuit 460 can remain constant if the input signal 170 is zero.

Figure 5A:
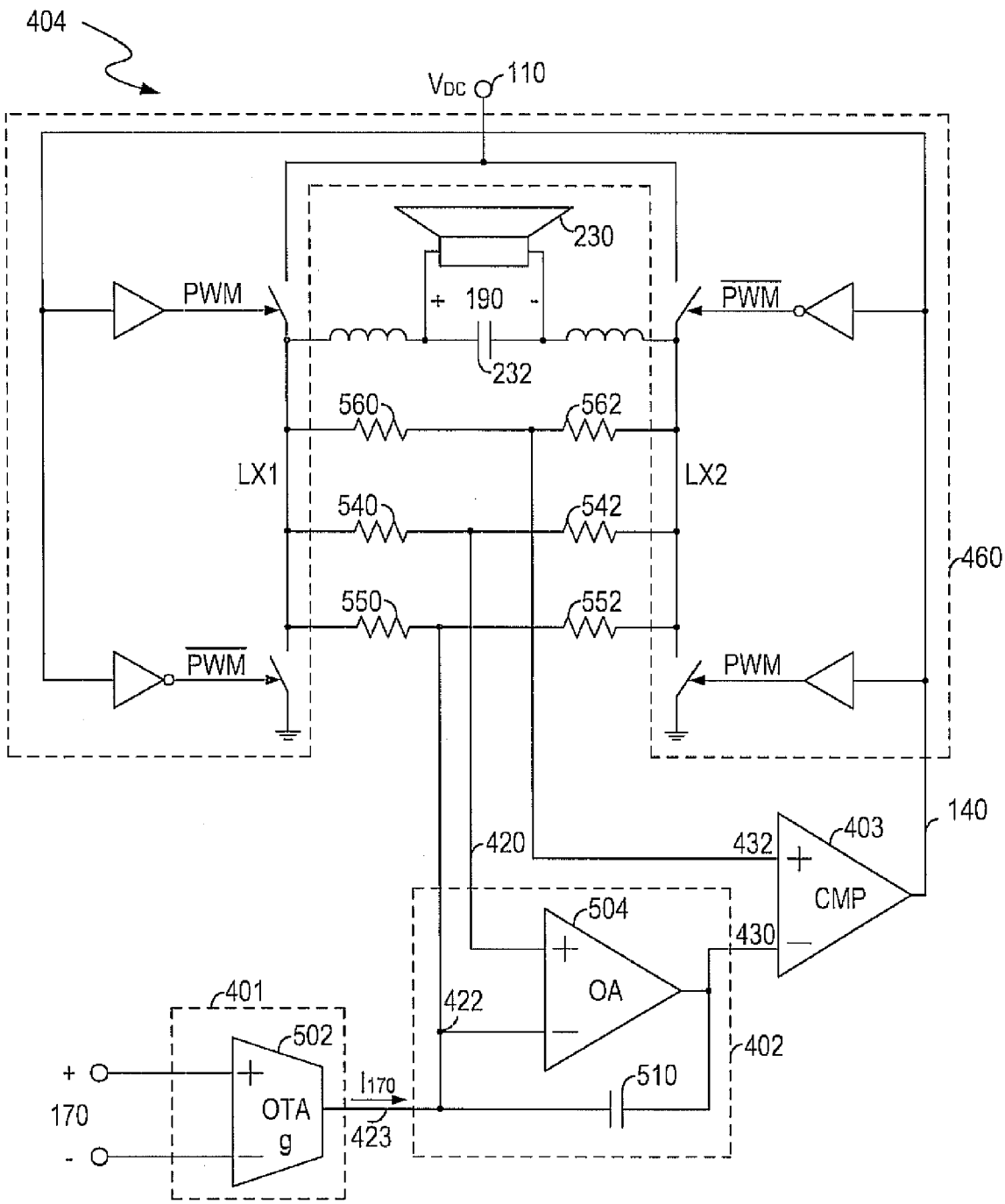
FIG. 5A shows a detailed circuit diagram of the amplifier in FIG. 4 coupled to a speaker, in accordance with one embodiment of the present invention.

FIG. 5A shows a detailed circuit diagram of the amplifier 404 coupled to a speaker 230 in FIG. 4, in accordance with one embodiment of the present invention. Elements that are labeled similar as in FIG. 1, FIG. 2 and FIG. 4 have similar functions and will not be repetitively described herein for purposes of brevity and clarity.

As shown in FIG. 5A, the amplifier 404 further includes a resistor divider, shown as resistor 560 and resistor 562, coupled between a first switching node LX1 and a second switching node LX2 of the full bridge circuit 460 for providing the hysteretic signal 432. In one embodiment, the resistor divider has a first resistor 560 that includes a first resistance $R_1$ less a second resistance $\Delta R_1$, and a second resistor 562 that includes the first resistance $R_1$ added to the second resistance $\Delta R_1$. Therefore, $R_{560}=R_1-\Delta R_1$ and $R_{562}=R_1+\Delta R_1$.

In one embodiment, the amplifier 404 further includes a resistor divider, shown as resistor 550 and resistor 552, coupled between a first switching node LX1 and a second switching node LX2 of the full bridge circuit 460 for providing a signal 422 to the integration stage 402. In one embodiment, the resistor divider has a first resistor 550 that includes a first resistance $R_2$ added to a second resistance $\Delta R_2$, and a second resistor 552 that includes the first resistance $R_2$ less the second resistance $\Delta R_2$. Therefore, $R_{550}=R_2+\Delta R_2$ and $R_{552}=R_2-\Delta R_2$.

In one embodiment, the translation stage 401 includes an operational transconductance amplifier 502 coupled to the integration stage 402 for converting the input signal 170 to an input current $I_{170}$. As such, the signal 423 includes the input current $I_{170}$. If a gain of the operational transconductance amplifier 502 is $g_{502}$ and a voltage of the input signal 170 is $V_{170}$, the input current $I_{170}$ can be given by:

$$I_{170}=g_{502}*V_{170}. \tag{17}$$

In one embodiment, the integration stage 402 includes an operational amplifier 504 and a capacitor 510. In one embodiment, the translation stage 401 can be coupled to a negative (inverting) terminal of the operational amplifier 504. In one embodiment, the amplifier 404 further includes a resistor divider, shown as resistor 540 and resistor 542, coupled between a first switching node LX1 and a second switching node LX2 of the full bridge circuit 460 for providing the signal 420 to the integration stage 402. In one embodiment, the resistor divider, shown as resistors 540 and 542, includes a resistor 540 and a resistor 542 having the same resistance R. In one embodiment, the resistor divider, shown as resistors 540 and 542, can be coupled to a positive (non-inverting) terminal of the operational amplifier 504. As such, in one embodiment, if a voltage of the power supply (at terminal 110) is $V_{DC}$, a voltage $V_{420}$ of the signal 420 can be given by $V_{420}=V_{DC}/2$. In other words, the voltage level of the signal 420 can be equal to half of the voltage level of the power supply $V_{DC}$, in one embodiment.

In one embodiment, a voltage $V_{422}$ of the signal 422 at the negative terminal of the operational amplifier 504 is equal to the voltage $V_{420}$ of the signal 420 at the positive terminal of the operational amplifier 504. Therefore, the voltage $V_{422}$ of the signal 422 can be given by $$V_{422}=V_{DC}/2. \tag{18}$$

As such, the voltage level of the signal 422 can be equal to half of the voltage level of the power supply $V_{DC}$. In other words, a voltage level of the common mode voltage $V_{CM}$ ($V_{CM}=(V_{420}+V_{422})/2$) of the integration stage 402 is constant, and more specifically, is equal to half of a voltage level of the power supply $V_{DC}$.

Advantageously, since the common mode voltage $V_{CM}$ of the operational amplifier 504 is constant and is independent of the input voltage $V_{170}$, an influence that may be caused by the input voltage $V_{170}$ on a common mode rejection ratio (CMRR) of the operational amplifier 504 can be eliminated, in one embodiment.

Furthermore, in one embodiment, a current-shunt feedback (e.g., the capacitor 510) of the integration stage 402 can lower an input impedance at the negative terminal of the operational amplifier 504, such that the output impedance of the operational transconductance amplifier 502 which is coupled to the negative terminal of the operational amplifier 504 can be lowered. Advantageously, the capability of the operational transconductance amplifier 502 for providing high current and for driving high capacitive load can be enhanced. Additionally, a signal-to-noise ration of the amplifier 404 can be improved, in one embodiment.

In one embodiment, the first switching node LX1 and the second switching node LX2 of the full bridge circuit 460 are out of phase. Therefore, a current flowing through the capacitor 510 of the integration stage 402 can have two different levels depending on the state of the switching nodes LX1 and LX2. In one embodiment, when the pulse width modulation signal 140 is high, the voltage at LX1 is $V_{DC}$ and voltage at LX2 is zero. In contrast, when the pulse width modulation signal 140 is low, the voltage at LX1 is zero and the voltage at LX2 is $V_{DC}$.

More specifically, when the pulse width modulation signal 140 is high, an integrating current $I_{510}$ flowing through the capacitor 510 can be calculated as:

$$I_{510}=(V_{DC}-V_{422})/(R_2+\Delta R_2)-V_{422}/(R_2-\Delta R_2)+I_{170}. \tag{19a}$$

When the pulse width modulation signal 140 is low, an integrating current $I_{510}'$ flowing through the capacitor 510 can be calculated as:

$$I_{510}'=(V_{DC}-V_{422})/(R_2-\Delta R_2)-V_{422}/(R_2+\Delta R_2)+I_{170}. \tag{19b}$$

Based on equation (17) and equation (18), equations (19a) and (19b) can be rewritten as $$I_{510}=-V_{DC}*\Delta R_2/(R_2^2-\Delta R_2^2)+g_{502}*V_{170} \quad (20a)$$

and $$I_{510}'=V_{DC}*\Delta R_2/(R_2^2-\Delta R_2^2)+g_{502}*V_{170} \quad (20b)$$

respectively.

Similarly, in one embodiment, a voltage level of the hysteretic signal 432 also have two different levels depending on the states of the switching nodes LX1 and LX2. When the pulse width modulation signal 140 is high, a voltage $V_{432}$ of the hysteretic signal 432 can be calculated as:

$$V_{432}=V_{DC}*(R_1+\Delta R_1)/2R_1=V_{DC}/2+V_{DC}*\Delta R_1/2R_1. \quad (21a)$$

When the pulse width modulation signal 140 is low, a voltage $V_{432}'$ of the hysteretic signal 432 can be calculated as:

$$V_{432}'=V_{DC}*(R_1-\Delta R_1)/2R_1=V_{DC}/2-V_{DC}*\Delta R_1/2R_1. \quad (21b)$$

As such, the voltage level of the hysteretic signal 432 can be centered at half of the voltage level of the power supply $V_{DC}$. More specifically, the range between the maximum and the minimum value of the hysteretic signal 432 is centered at half of the voltage level of the power supply $V_{DC}$.

Since an amplitude $A_{430}$ of the ramp signal 430 can be a difference between $V_{432}$ and $V_{432}'$, the amplitude $A_{430}$ can be given by $$A_{430}=|V_{432}-V_{432}'|=V_{DC}*\Delta R_1/R_1. \quad (22)$$

As such, a parameter limit, e.g., amplitude $A_{430}$, of the ramp signal 430 can be controlled by the resistor divider, shown as resistors 560 and 562.

Similarly, the voltage level of the ramp signal 430 can be centered at half of the voltage level of the power supply $V_{DC}$. More specifically, the range between the maximum and the minimum values of the ramp signal 430 is centered at half of the voltage level of the power supply $V_{DC}$.

If assume that $T_1$ is a period during which the pulse width modulation signal 140 is high, and $T_2$ is a period during which the pulse width modulation signal 140 is low, a charge change $\Delta Q_{510}$ of the capacitor 510 in the integration stage 402 can be given by:

$$\Delta Q_{510}=C_{510}*A_{430}=-I_{510}*T_1=I_{510}'*T_2, \quad (23)$$

where $C_{510}$ is a capacitance of the capacitor 510. Therefore, when equation (20a) and equation (20b) are substituted into equation (23), the following equation can be obtained:

$$(V_{DC}*\Delta R_2/(R_2^2-\Delta R_2^2)-g_{502}*V_{170})*T_1=(V_{DC}*\Delta R_2/(R_2^2-\Delta R_2^2)+g_{502}*V_{170})*T_2.$$

Therefore $$V_{DC}*(T_1-T_2)/(T_1+T_2)=g_{502}*V_{170}*(R_2^2-\Delta R_2^2)/\Delta R_2. \quad (24)$$

Since an equivalent theoretical voltage $V_{190eq}$ of the output signal 190 can be given by:

$$V_{190eq} = T_1/(T_1+T_2)*V_{DC} - T_2/(T_1+T_2)*V_{DC} \quad (25)$$
$$= (T_1-T_2)/(T_1+T_2)*V_{DC},$$

the gain $A_{404}$ of the amplifier 404 can be calculated as:

$$A_{404}=V_{190eq}/V_{170}=g_{502}*(R_2^2-\Delta R_2^2)/\Delta R_2, \quad (26)$$

in one embodiment. Advantageously, in one embodiment, the gain $A_{404}$ of the amplifier 404 can remain constant if the power supply $V_{DC}$ varies. Therefore, the gain of the amplifier 404 does not depend on the power supply $V_{DC}$, which can assure high power supply rejection ratio, in one embodiment.

According to equation (23), a switching frequency $f_{460}$ of the full bridge circuit 460 can be given by:

$$f_{460}=1/(T_1+T_2)=1/((-C_{510}*A_{430}/I_{510})+(C_{510}*A_{430}/I_{510}')). \quad (27a)$$

When equations (20a), (20b) and (22) are substituted into equation (27a), the switching frequency $f_{460}$ can be rewritten as:

$$f_{460}=R_1*\Delta R_2/(2C_{510}*\Delta R_1*(R_2^2-\Delta R_2^2))-(g_{502}^2*R_1*(R_2^2-\Delta R_2^2)/(2C_{510}*\Delta R_1*\Delta R_2))*(V_{170}/V_{DC})^2. \quad (27b)$$

Therefore, the following equation can be obtained:

$$f_{460}=K_3+K_4*(V_{170}/V_{DC})^2, \quad (28)$$

where $K_3$ is a constant that is equal to $R_1*\Delta R_2/(2C_{510}*\Delta R_1*(R_2^2-\Delta R_2^2))$, and $K_4$ is a constant that is equal to $-g_{502}^2*R_1*(R_2^2-\Delta R_2^2)/(2C_{510}*\Delta R_1*\Delta R_2)$.

Therefore, the switching frequency $f_{460}$ relates to the input voltage $V_{170}$ and the supply voltage $V_{DC}$, in one embodiment. In addition, the switching frequency $f_{460}$ of the full bridge circuit 460 can remain constant if the input signal 170 is zero.

Figure 5B:
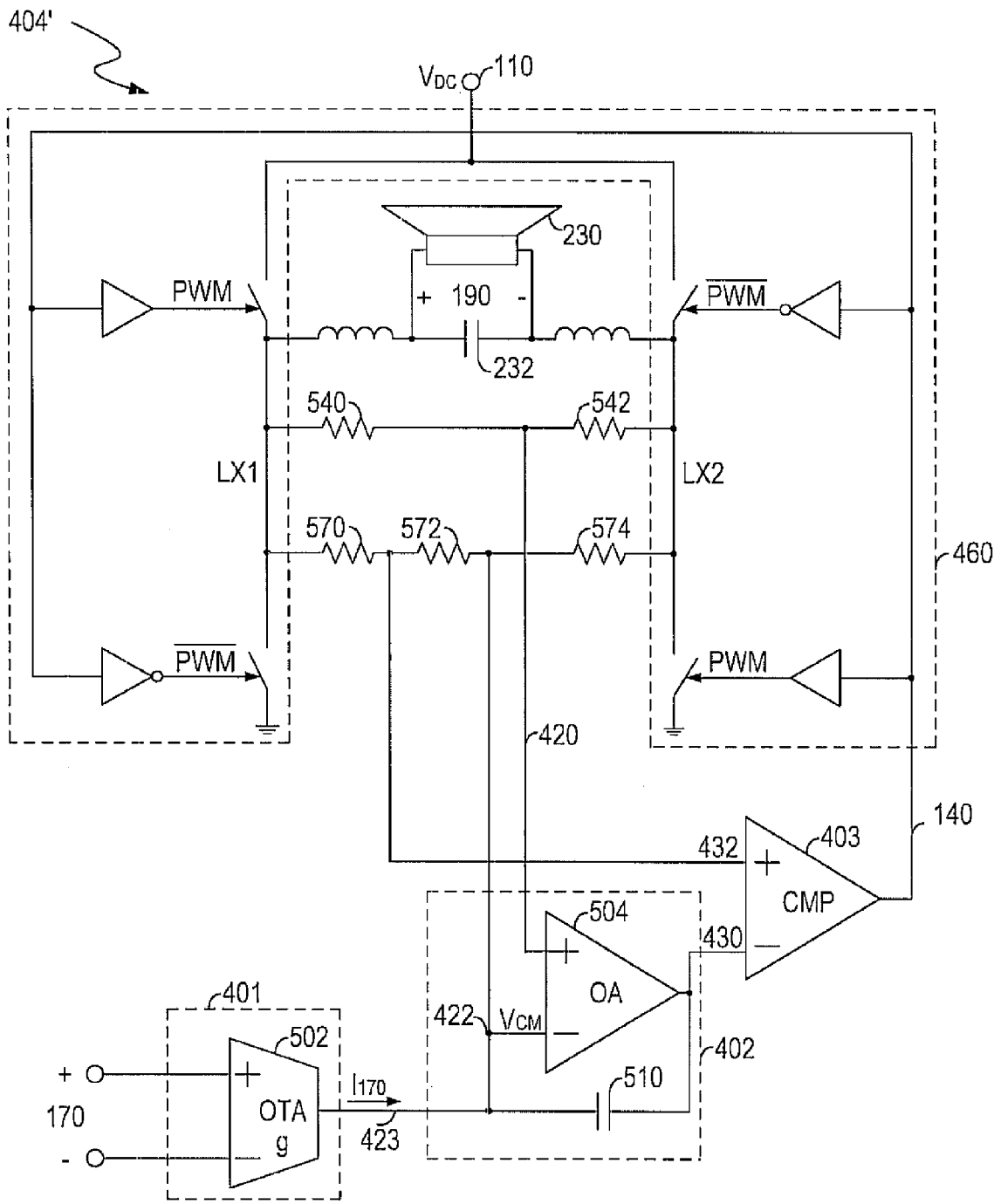
FIG. 5B shows another detailed circuit diagram of the amplifier in FIG. 5 coupled to a speaker, in accordance with one embodiment of the present invention.

FIG. 5B shows a block diagram of an amplifier 404' coupled to the speaker 230, in accordance with one embodiment of the present invention. Elements that are labeled the same as in FIG. 5A have similar functions and will not be repetitively described herein for purpose of clarity and brevity. In one embodiment, the aforementioned resistor divider shown as resistors 560 and 562 in FIG. 5A, and the aforementioned resistor divider shown as resistors 550 and 552 in FIG. 5A, can be compacted to a single resistor divider, shown as resistor 570, resistor 572 and resistor 574 in FIG. 5B.

In one embodiment, the resistor divider, shown as resistors 570, 572 and 574, coupled between a first switching node LX1 and a second switching node LX2 of the full bridge circuit 460 can be used for providing the hysteretic signal 432 and the signal 422.

More specifically, in one embodiment, the resistor 570 includes a first resistance $R_3$ less a second resistance $\Delta R_3$, the resistor 572 includes a resistance that is twice as the second resistance $\Delta R_3$, and the resistor 574 includes the first resistance $R_3$ less the second resistance $\Delta R_3$. Therefore, $R_{570}=R_3-\Delta R_3$, $R_{572}=2\Delta R_3$, and $R_{574}=R_3-\Delta R_3$.

The operation and functionality of the amplifier in FIG. 5B is similar as that in FIG. 5A. In one embodiment, when the pulse width modulation signal 140 is high, an integrating current $I_{510b}$ flowing through the capacitor 510 can be calculated as:

$$I_{510b}=-V_{DC}*\Delta R_3/(R_3^2-\Delta R_3^2)+g_{502}*V_{170}. \quad (29a)$$

When the pulse width modulation signal 140 is low, an integrating current $I_{510b}'$ flowing through the capacitor 510 can be calculated as $$I_{510b}'=V_{DC}*\Delta R_3/(R_2^2-\Delta R_3^2)+g_{502}*V_{170}. \quad (29b)$$

According to one embodiment in FIG. 5B, the following equations can be obtained:

$$V_{DC}*(T_1-T_2)/(T_1+T_2)=g_{502}*V_{170}*(R_2^2-\Delta R_3^2)/\Delta R_3, \quad (30)$$

$$V_{190eq}=(T_1-T_2)/(T_1+T_2)*V_{DC}, \quad (31)$$

and $$A_{404b} = V_{190eq}/V_{170} = g_{502}*(R_3^2 - \Delta R_3^2)/\Delta R_3, \quad (32)$$

where $A_{404b}$ is a gain of the amplifier 404' and can remain constant if the power supply $V_{DC}$ varies.

When the pulse width modulation signal 140 is high, a voltage $V_{432b}$ of the hysteretic signal 432 can be calculated as:

$$V_{432b} = V_{422} + (V_{DC} - V_{422})*R_{572}/(R_{570}+R_{572}) \quad (33a)$$
$$= (V_{DC}/2)*(1 + 2\Delta R_3/(R_3 + \Delta R_3)).$$

When the pulse width modulation signal 140 is low, a voltage $V_{432b}'$ of the hysteretic signal 432 can be calculated as:

$$V_{432b}' = V_{422}*R_{570}/(R_{570}+R_{572}) \quad (33b)$$
$$= (V_{DC}/2)*(1 - 2\Delta R_3/(R_3 + \Delta R_3)).$$

Therefore, an amplitude $A_{430b}$ of the ramp signal 430 in FIG. 5B can be given by:

$$A_{430b} = |V_{432b} - V_{432b}'| = 2V_{DC}*\Delta R_3/(R_3 + \Delta R_3). \quad (34)$$

As such, a switching frequency $f_{460b}$ of the full bridge circuit 460 in FIG. 5B can be calculated as $$f_{460b} = 1/(T_1 T_2) \quad (35)$$
$$= 1/((-C_{510}*A_{430b}/I_{510b}) + (C_{510}*A_{430b}/I_{510b}'))$$
$$= 1/(4C_{510}*(R_3 - \Delta R_3)) - ((R_3^2 - \Delta R_3^2)*(R_3 + \Delta R_3)*$$
$$g_{502}^2/(4C_{510}*\Delta R_3^2))*(V_{170}/V_{DC})^2.$$

Therefore, the following equation can be obtained:

$$f_{460b} = K_5 + K_6*(V_{170}/V_{DC})^2, \quad (36)$$

where $K_5$ is a constant that is equal to $1/(4C_{510}*(R_3-\Delta R_3))$, and $K_6$ is a constant that is equal to $-(R_3^2-\Delta R_3^2)*(R_3+\Delta R_3)*g_{502}^2/(4C_{510}*\Delta R_3^2)$.

Similarly, the switching frequency $f_{460b}$ relates to the input voltage $V_{170}$ and the supply voltage $V_{DC}$, in one embodiment. In addition, the switching frequency $f_{460b}$ of the full bridge circuit 460 can remain constant if the input signal 170 is zero.

Figure 5C:
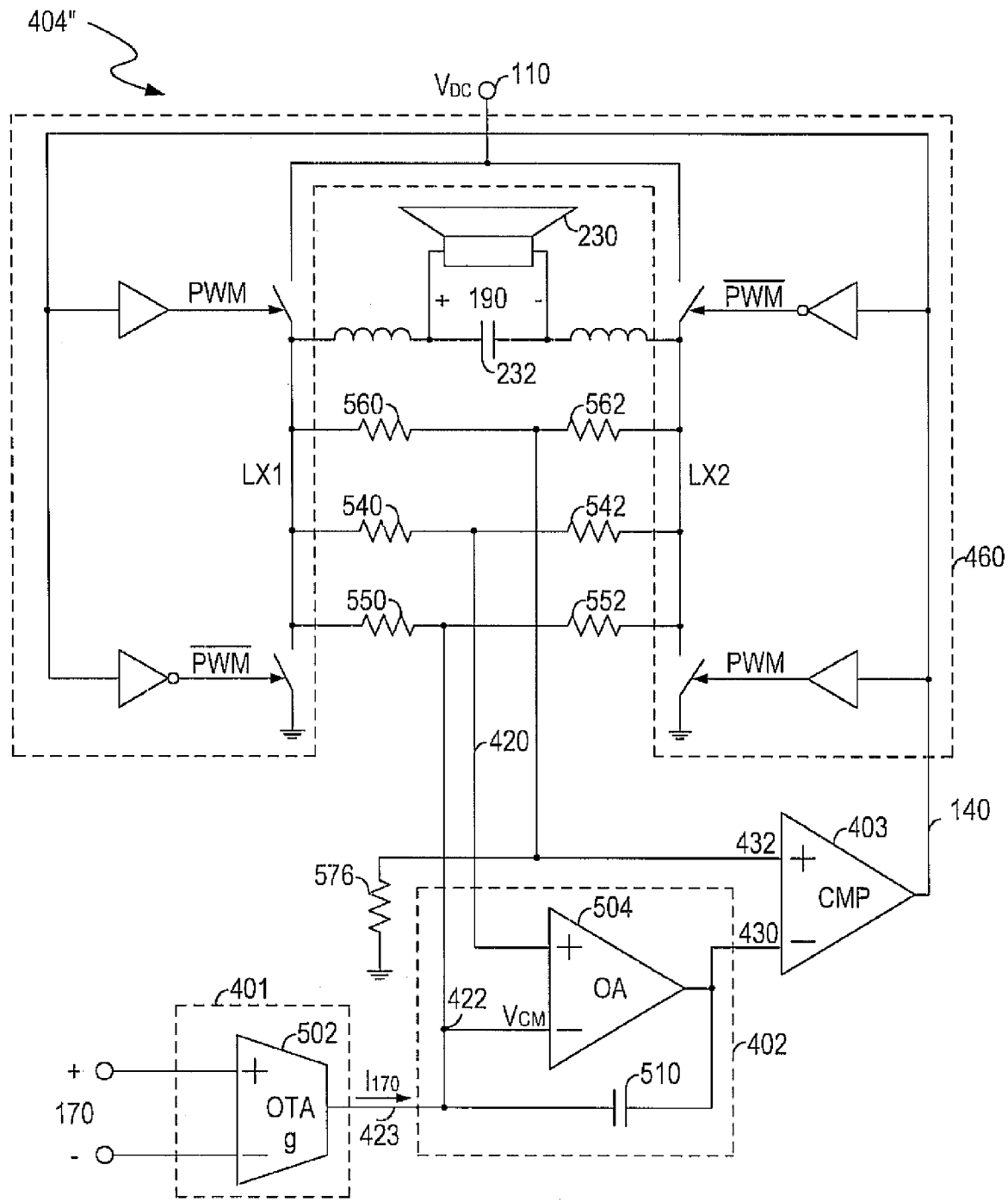
FIG. 5C shows another detailed circuit diagram of the amplifier in FIG. 5 coupled to a speaker, in accordance with one embodiment of the present invention.

In the examples of FIG. 5A and FIG. 5B, each of the aforementioned amplifiers 404 and 404' can generate a hysteretic signal 432 that has a voltage level that can be centered at $V_{DC}/2$ and generate a ramp signal 430 that has a voltage level that can also be centered at $V_{DC}/2$. However, a voltage level of the hysteretic signal 432 and/or ramp signal 430 can also be centered at a voltage level that is different from $V_{DC}/2$. FIG. 5C shows a block diagram of an amplifier 404" coupled to the speaker 230, in accordance with one embodiment of the present invention. Elements that are labeled the same as FIG. 5A and FIG. 5B have similar functions and will not be repetitively described herein for purpose of clarity and brevity.

For example, a resistor 576 shown in FIG. 5C can be coupled between the resistor divider (shown as resistors 560 and 562) and ground for shifting the voltage level of the hysteretic signal 432. If a resistance of the resistor 576 is $R_1$, a voltage $V_{432c}$ of the hysteretic signal 432 can be calculated as:

$$V_{432c} = V_{DC} * ((R_1 + \Delta R_1) // R_1)/((R_1 + \Delta R_1) // R_1 + \quad (37a)$$
$$(R_1 - \Delta R_1))$$
$$= V_{DC} * R_1 * (R_1 + \Delta R_1) // (3R_1^2 - \Delta R_1^2).$$

when the pulse width modulation signal 140 is high. Additionally, a voltage $V_{432c}'$ of the hysteretic signal 432 can be calculated as:

$$V_{432c}' = V_{DC} * ((R_1 - \Delta R_1) // R_1)/((R_1 - \Delta R_1) // R_1 + \quad (37b)$$
$$(R_1 + \Delta R_1))$$
$$= V_{DC} * R_1 * (R_1 - \Delta R_1) // (3R_1^2 - \Delta R_1^2),$$

when the pulse width modulation signal 140 is low. Therefore, an amplitude $A_{430c}$ of the ramp signal 430 in FIG. 5C can be given by:

$$A_{430c} = |V_{432c} - V_{432c}'| 2V_{DC}*R_1*\Delta R_1/(3R_1^2 - \Delta R_1^2). \quad (38)$$

As such, a switching frequency $f_{460c}$ of the full bridge circuit 460 in FIG. 5C can be calculated as:

$$f_{460c} = ((3R_1^2 - \Delta R_1^2)/(2C_{510}*R_1*\Delta R_1))*(\Delta R_2/(R_2^2 - \Delta R_2^2) - ((R_2^2 - \Delta R_2^2)*g_{502}^2/\Delta R_2)*(V_{170}/V_{DC})^2. \quad (39)$$

Therefore, the following equation can be obtained:

$$f_{460C} = K_7 + K_8*(V_{170}/V_{DC})^2, \quad (40)$$

where $K_7$ is a constant that is equal to $(3R_1^2-\Delta R_1^2)*\Delta R_2/(2C_{510}*R_1*\Delta R_1*(R_2^2-\Delta R_2^2))$, and $K_8$ is a constant that is equal to $-(3R_1^2-\Delta R_1^2)*(R_2^2-\Delta R_2^2)*g_{502}^2/(2C_{510}*R_1*\Delta R_1*\Delta R_2)$. Similarly, the switching frequency $f_{460c}$ of the full bridge circuit 460 can remain constant if the input signal 170 is zero.

The calculations for the gain $A_{404C}$ of the amplifier 404" in the example of FIG. 5C are similar as the calculations in the example of FIG. 5A. In one embodiment, the gain $A_{404C}$ of the amplifier 404" can be calculated as: $A_{404C} = g_{502}*(R_2^2 - \Delta R_2^2)/\Delta R_2$. Similarly, the gain $A_{404C}$ of the amplifier 404" can remain constant if the power supply $V_{DC}$ varies.

In one embodiment, the resistor 576 can also have other resistance. In another embodiment, a resistor (not shown in FIG. 5C for purposes of brevity and clarity) can also be coupled between the resistor divider (shown as resistors 560 and 562) and the power supply (at terminal 110) for shifting the voltage level of the hysteretic signal 432. Similar calculations for the amplitude of the ramp signal 430 and the switching frequency of the full bridge circuit 460 will not be described herein for purposes of brevity and clarity.

Figure 6:
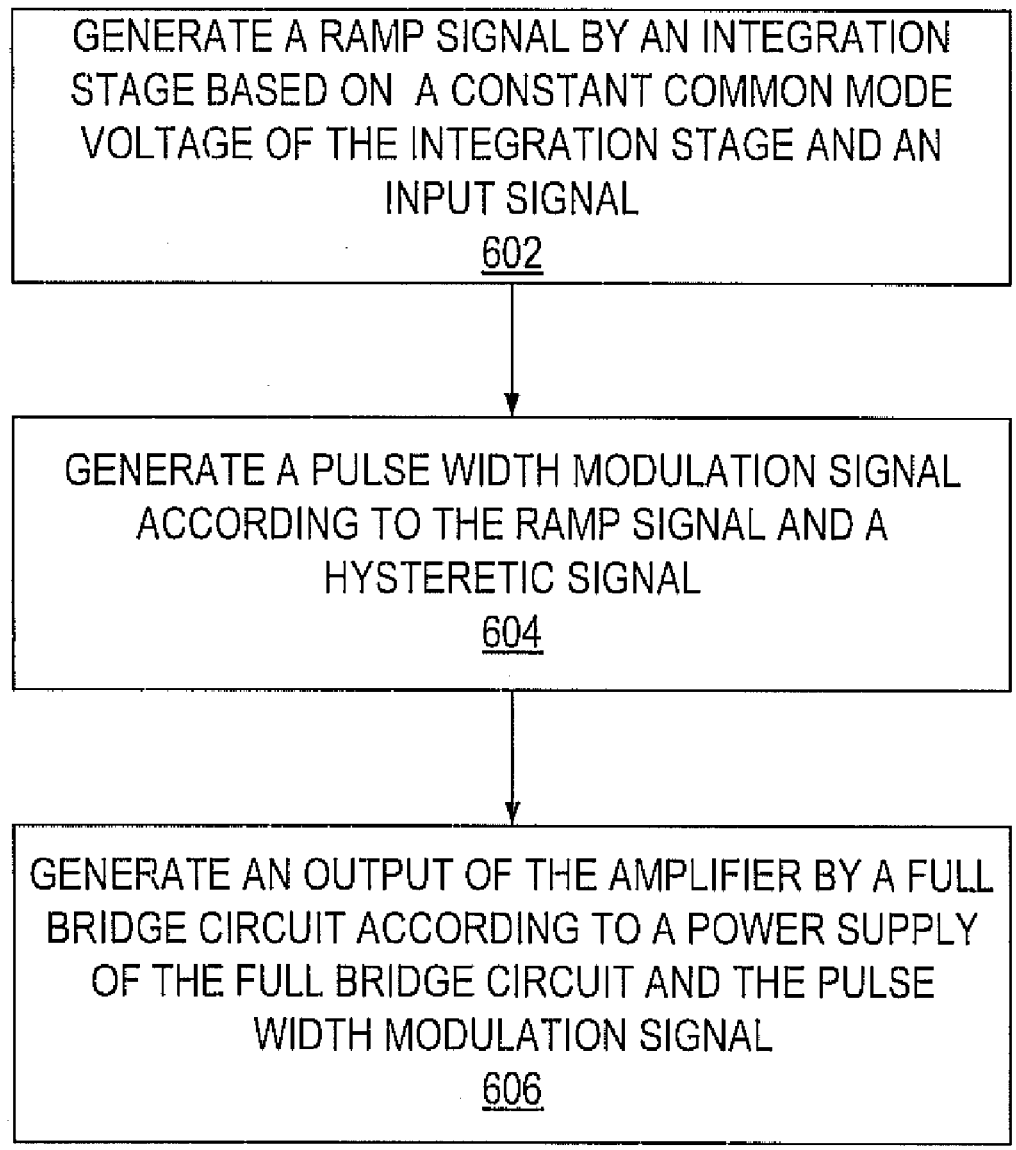
FIG. 6 shows a flowchart of operations performed by an amplifier, in accordance with one embodiment of the present invention.

FIG. 6 shows a flowchart 600 of operations performed by an amplifier that can amplify an input signal 170, in accordance with one embodiment of the present invention. FIG. 6 is described in combination with FIG. 4, FIG. 5A, FIG. 5B and FIG. 5C.

As shown in block 602, an integration stage 402 can generate a ramp signal 430 based on a constant common mode voltage $V_{CM}$ of the integration stage 402 and the input signal 170. In one embodiment, a translation stage 401 can be implemented for converting the input signal 170 to an input current received by the integration stage 102. In one embodiment, a voltage level of the constant common mode voltage $V_{CM}$ can be equal to half of a voltage level of a power supply $V_{DC}$.

In one embodiment, a comparison stage 103 can be implemented for comparing the ramp signal with a hysteretic signal from the full bridge circuit 460, and for generating a pulse width modulation signal 140 for driving the full bridge circuit 460. In other words, in block 604, the amplifier can generate a pulse width modulation signal 140 according to the ramp signal 430 and the hysteretic signal 432.

As such, the full bridge circuit 460 can generate an output 190 of the amplifier (404, 404' or 404") according to the power supply $V_{DC}$ of the full bridge circuit 460 and the pulse width modulation signal 140, in block 606. Advantageously, in one embodiment, the amplifier (404, 404' or 404") can produce a gain that can remain constant even if the power supply $V_{DC}$ varies.

Accordingly, embodiments according to the present invention provide a class-D amplifier that can amplify an input signal to an output signal by a full bridge circuit, an integration stage, and a comparison stage. A ramp signal generated by the integration stage according to the input signal can be compared with a hysteretic signal from the full bridge circuit by a comparison stage in order to generate a pulse width modulation signal. In one embodiment, a duty cycle of the pulse width modulation signal that can be used for driving the full bridge circuit can be defined by the input signal. As such, the full bridge circuit can generate an amplified output signal that is proportional to the input signal, in one embodiment. A gain of the amplifier can be independent of a power supply powering the amplifier, such that the power supply rejection ratio of the amplifier can be increased.

While the foregoing description and drawings represent the exemplary embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. An amplifier comprising:
    an integration stage operable for receiving a common mode voltage determined by a power supply, receiving a first signal representing an input signal of said amplifier, and generating a ramp signal based on said common mode voltage and said first signal; and
    an output circuit coupled to said integration stage and operable for receiving said power supply, generating a hysteretic signal to control said ramp signal, and generating an output signal of said amplifier according to said ramp signal.

2. The amplifier as claimed in claim 1, further comprising:
    a comparison stage coupled to said integration stage and said output circuit and for generating a pulse width modulation signal according to said ramp signal and said hysteretic signal to control said output circuit.

3. The amplifier as claimed in claim 1, wherein a voltage level of said common mode voltage is substantially equal to half of a voltage level of said power supply.

4. The amplifier as claimed in claim 1, further comprising:
    a translation stage coupled to said integration stage for receiving said input signal and for providing said first signal to said integration stage.

5. The amplifier as claimed in claim 4, wherein said translation stage comprises an operational amplifier coupled to said integration stage and for converting said input signal to an input current, and wherein said first signal comprises said input current.

6. The amplifier as claimed in claim 4, wherein said integration stage comprises an operational amplifier and a capacitor, and wherein said translation stage is coupled to said capacitor and an input terminal of said operational amplifier.

7. The amplifier as claimed in claim 1, wherein said output circuit comprises a full bridge circuit.

8. The amplifier as claimed in claim 7, wherein a switching frequency of said full bridge circuit remains substantially constant if said input signal is zero.

9. The amplifier as claimed in claim 1, wherein said output circuit comprises a resistor divider coupled between a first switching node and a second switching node of a full bridge circuit, and for providing said hysteretic signal.

10. The amplifier as claimed in claim 9, wherein a limit of said ramp signal is controlled by said resistor divider.

11. The amplifier as claimed in claim 1, wherein said output circuit comprises a resistor divider coupled between a first switching node and a second switching node of a full bridge circuit for providing a second signal to said integration stage.

12. The amplifier as claimed in claim 11, wherein a voltage level of said second signal is substantially centered at half of a voltage level of said power supply.

13. The amplifier as claimed in claim 1, wherein a gain of said amplifier remains substantially constant if said power supply varies.

14. The amplifier as claimed in claim 1, wherein said hysteretic signal controls a limit of said ramp signal.

15. An audio system comprising:
    an amplifier operable for generating an output signal according to an input signal of said amplifier, said amplifier comprising:
        an integration stage operable for receiving a common mode voltage determined by a power supply, receiving a first signal representing said input signal, and generating a ramp signal based on said common mode voltage and said first signal; and
        an output circuit coupled to said integration stage and operable for receiving said power supply, generating a hysteretic signal to control said ramp signal, and generating said output signal according to said ramp signal; and
    a speaker coupled to said amplifier and for converting said output signal to audible sound.

16. The audio system as claimed in claim 15, further comprising:
    a comparison stage coupled to said integration stage and said output circuit and for generating a pulse width modulation signal according to said ramp signal and said hysteretic signal to control said output circuit.

17. The audio system as claimed in claim 15, wherein a voltage level of said common mode voltage is substantially equal to half of a voltage level of said power supply.

18. The audio system as claimed in claim 15, further comprising:
    a translation stage coupled to said integration stage for receiving said input signal and for providing said first signal to said integration stage.

19. The audio system as claimed in claim 18, wherein said translation stage comprises an operational amplifier coupled to said integration stage and for converting said input signal to an input current, and wherein said first signal comprises said input current.

20. The audio system as claimed in claim 18, wherein said integration stage comprises an operational amplifier and a capacitor, and wherein said translation stage is coupled to said capacitor and an input terminal of said operational amplifier.

21. The audio system as claimed in claim 15, wherein said output circuit comprises a resistor divider coupled between a first switching node and a second switching node of a full bridge circuit for providing said hysteretic signal.

22. The audio system as claimed in claim 15, wherein a gain of said amplifier remains substantially constant if said power supply varies.

23. A method for amplifying an input signal, said method comprising:
   generating a ramp signal by an integration stage based on a common mode voltage of said integration stage and said input signal, said common mode voltage determined by a power supply provided to an output circuit;
   generating a hysteretic signal by said output circuit to control said ramp signal; and
   generating an amplified output signal by said output circuit according to said ramp signal.

24. The method as claimed in claim 23, further comprising:
   comparing said ramp signal with said hysteretic signal; and
   generating a pulse width modulation signal to control said output circuit according to said comparison.

25. The method as claimed in claim 23, wherein a voltage level of said common mode voltage is substantially equal to half of a voltage level of said power supply.

26. The method as claimed in claim 23, further comprising:
   converting said input signal to an input current.

27. The method as claimed in claim 23, further comprising:
   producing a gain that remains substantially constant if said power supply varies.

* * * * *